United States Patent
Webb

(10) Patent No.: US 8,686,522 B2
(45) Date of Patent: Apr. 1, 2014

(54) SEMICONDUCTOR TRENCH INDUCTORS AND TRANSFORMERS

(75) Inventor: Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 13/272,485

(22) Filed: Oct. 13, 2011

(65) Prior Publication Data

US 2013/0093032 A1 Apr. 18, 2013

(51) Int. Cl.
H01L 29/82 (2006.01)
H01L 21/02 (2006.01)

(52) U.S. Cl.
USPC .......................................... 257/421; 257/659

(58) Field of Classification Search
USPC .......... 257/E29.323, E21.022, 421–427, 659; 438/3, 48
See application file for complete search history.

(56) References Cited

U.S. PATENT DOCUMENTS

| | | | |
|---|---|---|---|
| 5,307,004 A | 4/1994 | Carsten | |
| 5,811,868 A | 9/1998 | Bertin et al. | |
| 6,221,769 B1 | 4/2001 | Dhong et al. | |
| 6,413,788 B1 * | 7/2002 | Tuttle | 438/3 |
| 6,417,561 B1 * | 7/2002 | Tuttle | 257/659 |
| 6,501,144 B1 * | 12/2002 | Rizzo | 257/421 |
| 6,545,450 B1 | 4/2003 | Ledenev et al. | |
| 6,573,818 B1 | 6/2003 | Klemmer et al. | |
| 6,590,786 B2 | 7/2003 | Gurov | |
| 6,639,388 B2 | 10/2003 | Tihanyi | |
| 6,653,676 B2 | 11/2003 | Tsu et al. | |
| 6,686,727 B2 | 2/2004 | Ledenev et al. | |
| 6,694,438 B1 | 2/2004 | Porter et al. | |
| 6,696,823 B2 | 2/2004 | Ledenev et al. | |
| 6,891,461 B2 * | 5/2005 | Gardner | 336/200 |
| 6,900,490 B2 * | 5/2005 | Asao et al. | 257/295 |
| 6,906,402 B2 | 6/2005 | Forbes et al. | |
| 6,921,953 B2 * | 7/2005 | Deak | 257/421 |
| 6,943,038 B2 * | 9/2005 | Meixner et al. | 438/3 |
| 6,962,872 B2 | 11/2005 | Chudzik et al. | |
| 7,030,481 B2 | 4/2006 | Chudzik et al. | |
| 7,087,976 B2 | 8/2006 | Gardner | |
| 7,119,650 B2 * | 10/2006 | Gardner | 336/200 |
| 7,169,622 B2 * | 1/2007 | Grynkewich et al. | 438/3 |
| 7,381,573 B2 * | 6/2008 | Deak | 438/3 |
| 7,411,262 B2 * | 8/2008 | Deak | 257/421 |
| 7,423,508 B2 | 9/2008 | Gardner et al. | |

(Continued)

OTHER PUBLICATIONS

S. Prabhakaran et al., "Microfabricated Coupled Inductors for DC-DC Converters for Microprocessor Power Delivery," 35th Annual IEEE Power Electronics Specialists Conference, 2004, pp. 4467-4472, Aachen, Germany.

(Continued)

*Primary Examiner* — Long K Tran
*Assistant Examiner* — Jordan Klein
(74) *Attorney, Agent, or Firm* — Louis J. Percello; Ryan, Mason & Lewis, LLP

(57) ABSTRACT

Semiconductor trench inductor and transformer structures are provided, which include thin film conductive layers and magnetic layers formed within trenches etched in semiconductor substrates. Semiconductor trench devices effectively provide vertical oriented inductor and transformer structures whereby conductive coils and magnetic layers are vertically oriented on edge within trenches, thereby providing a space-saving compact design, and which allows the conductive layers within the trench to be enclosed by magnetic material, thereby providing a density of magnetic material that increases the storable energy density.

20 Claims, 9 Drawing Sheets

(56) References Cited

U.S. PATENT DOCUMENTS

| | | |
|---|---|---|
| 7,488,680 B2 | 2/2009 | Andry et al. |
| 7,636,242 B2 | 12/2009 | Hazucha et al. |
| 7,710,234 B2 | 5/2010 | Gardner et al. |
| 7,719,084 B2 | 5/2010 | Gardner et al. |
| 7,733,204 B2 | 6/2010 | Hahn et al. |
| 7,755,124 B2 | 7/2010 | Fajardo et al. |
| 7,772,819 B2 | 8/2010 | Abu Qahouq et al. |
| 7,791,447 B2 | 9/2010 | Gardner |
| 7,898,773 B2 * | 3/2011 | Han et al. ............ 360/319 |
| 8,405,453 B2 * | 3/2013 | Woods et al. ............ 327/553 |
| 2004/0087163 A1 * | 5/2004 | Steimle et al. ............ 438/694 |
| 2004/0108587 A1 | 6/2004 | Chudzik et al. |
| 2004/0175845 A1 * | 9/2004 | Molla et al. ............ 438/3 |
| 2005/0023664 A1 | 2/2005 | Chudzik et al. |
| 2009/0050992 A1 * | 2/2009 | Kools et al. ............ 257/422 |

OTHER PUBLICATIONS

"The Case for Coupled Inductor in Multiphase Buck Converters," Whitepaper, http://www.idt.com/content/coupledinductorp1.pdf, Dec. 2008, pp. 1-10.

* cited by examiner

SEMICONDUCTOR TRENCH INDUCTORS AND TRANSFORMERS

TECHNICAL FIELD OF THE INVENTION

This invention relates generally to semiconductor trench inductor and transformer devices and methods for fabricating semiconductor trench inductor and trench transformer devices.

BACKGROUND

Thin film inductors are one of the possible solutions for future microprocessor power conversion needs. To efficiently convert power, inductors should be designed with low loss and a high quality factor, Q. In addition, for many applications, it is important for the inductor layout area to be small to save silicon space, while providing large power storage per unit area. Inductors are typically formed as planar structures on top of semiconductor substrates having planar metal layers patterned in a spiraling manner in order to create multiple turn inductive windings. One disadvantage to planar inductor designs in that the windings generally form relatively low Q circuits. Moreover, increasing the amount of turns required more silicon area, which reduces the amount of silicon area available for other devices and wiring.

One way of increasing the Q of an inductor is by wrapping a ferromagnetic core around the coils of the inductor. The ferromagnetic material enables the inductor to store more energy for a given current, and therefore increases power that can be delivered for a given resistance loss. However, the magnetic fields in the ferromagnetic material are limited by saturation. Saturation places a limit on the maximum current, and therefore limits the maximum power that the inductor can support.

SUMMARY OF THE INVENTION

Exemplary embodiments of the invention generally include semiconductor trench inductor and transformer structures comprising thin film conductive layers and magnetic layers formed within trenches that are etched in semiconductor substrates. Semiconductor trench devices effectively provide vertical oriented inductor and transformer structures whereby conductive coils and magnetic layers are vertically oriented on edge within trenches, thereby providing a space-saving compact design that allows the conductive layers within the trench to be enclosed by magnetic material, thereby providing a density of magnetic material, which increases the storable energy density.

For example, in one exemplary embodiment of the invention, a semiconductor device includes a semiconductor substrate and a trench formed in the semiconductor substrate. The trench is defined by sidewalls and a bottom surface. A magnetic layer is formed in the trench, wherein the magnetic layer conformally lines the trench sidewalk and bottom surface. An insulating layer conformally lines the magnetic layer in the trench. A first conductor layer is formed the trench, wherein the first conductor layer is electrically insulated from the magnetic layer by the insulating layer. An upper magnetic layer is formed on the substrate and covers the trench. The upper magnetic layer and the magnetic layer in the trench form a closed loop of magnetic material that encircles as least a portion of the first conductor layer formed in the trench.

In another exemplary embodiment of the invention, a semiconductor device includes a semiconductor substrate, and a first trench and second trench formed in the semiconductor substrate. The first and second trenches are each defined by sidewalls and a bottom surface. A magnetic layer is formed over the semiconductor substrate, wherein the magnetic layer conformally lines the sidewalk and bottom surfaces of the first and second trenches. An insulating layer conformally lines the magnetic layer in the first and second trenches. At least one conductor is formed in each of the first and second trenches, wherein the at least one conductor in each of the first and second trenches is electrically insulated from the magnetic layer by the insulating layer. An upper magnetic layer is formed on the substrate and covers the trench. The upper magnetic layer and the magnetic layer within the first and second trenches form a closed loop of magnetic material that encircles as least a portion of the first conductors formed in each of the first and second trenches. The upper magnetic layer is dome-shaped.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3A, 3B, 3C, 3D, 3E, 3F, 3G, 3H, 3I and schematically illustrate a method for constructing a semiconductor trench device, according to an exemplary embodiment of the invention, wherein:

FIG. 3A is a cross-sectional view of a semiconductor trench device at an initial stage of fabrication wherein a trench is formed in a silicon substrate, FIG. 3B is a cross-sectional view of the structure of FIG. 3A after forming a first conformal insulating layer and a first seed layer over the substrate, FIG. 3C is a cross-sectional view of the structure of FIG. 3B after forming a first magnetic layer over a portion of the first conformal seed layer within the trench, FIG. 3D is a cross-sectional view of the structure of FIG. 3C after forming a second conformal insulating layer and a second seed layer over the substrate, FIG. 3E is a cross-sectional view of the structure of FIG. 3D after forming a second magnetic layer over a portion of the second conformal seed layer within the trench, FIG. 3F is a cross-sectional view of the structure of FIG. 3E after forming a third conformal insulating layer and a third seed layer over the substrate, FIG. 3G is a cross-sectional view of the structure of FIG. 3F after growing a first conformal conductive layer aver a portion of the third seed layer within the trench and forming a fourth insulating layer and fourth seed layer over a portion of the first conductive layer within the trench, FIG. 3H is a cross-sectional view of the structure of FIG. 3G after forming a second conductive layer over the fourth seed layer within the trench, FIG. 3I is a cross-sectional view of the structure of FIG. 3H after planarizing the surface of the structure of FIG. 3H.

DETAILED DESCRIPTION OF EXEMPLARY EMBODIMENTS

Exemplary embodiments of the invention will now be described in further detail with regard to semiconductor trench inductor and trench transformer devices that can be fabricated using state of the art thin film and silicon processing techniques. More specifically, as described in further detail below, exemplary embodiments of the invention include semiconductor trench inductor and transformer structures comprising thin film conductive coil layers and magnetic layers formed within trenches that are etched in semiconductor dies or silicon carriers. Trench devices according to principles of the invention, in effect, provide vertical oriented inductor and transformer structures whereby conductive coils and magnetic layers are vertically oriented on edge within trenches, thereby providing a space-saving compact design, which takes up less silicon area as compared to conventional planar inductor and transformer structures that are built on top of the substrate surface. Moreover, according to principles of the invention, semiconductor inductor and transformer trench structures allow conductive layers within trenches to be enclosed by magnetic material, thereby providing a density of magnetic material that increases the storable energy density of the trench devices.

Figure 1:
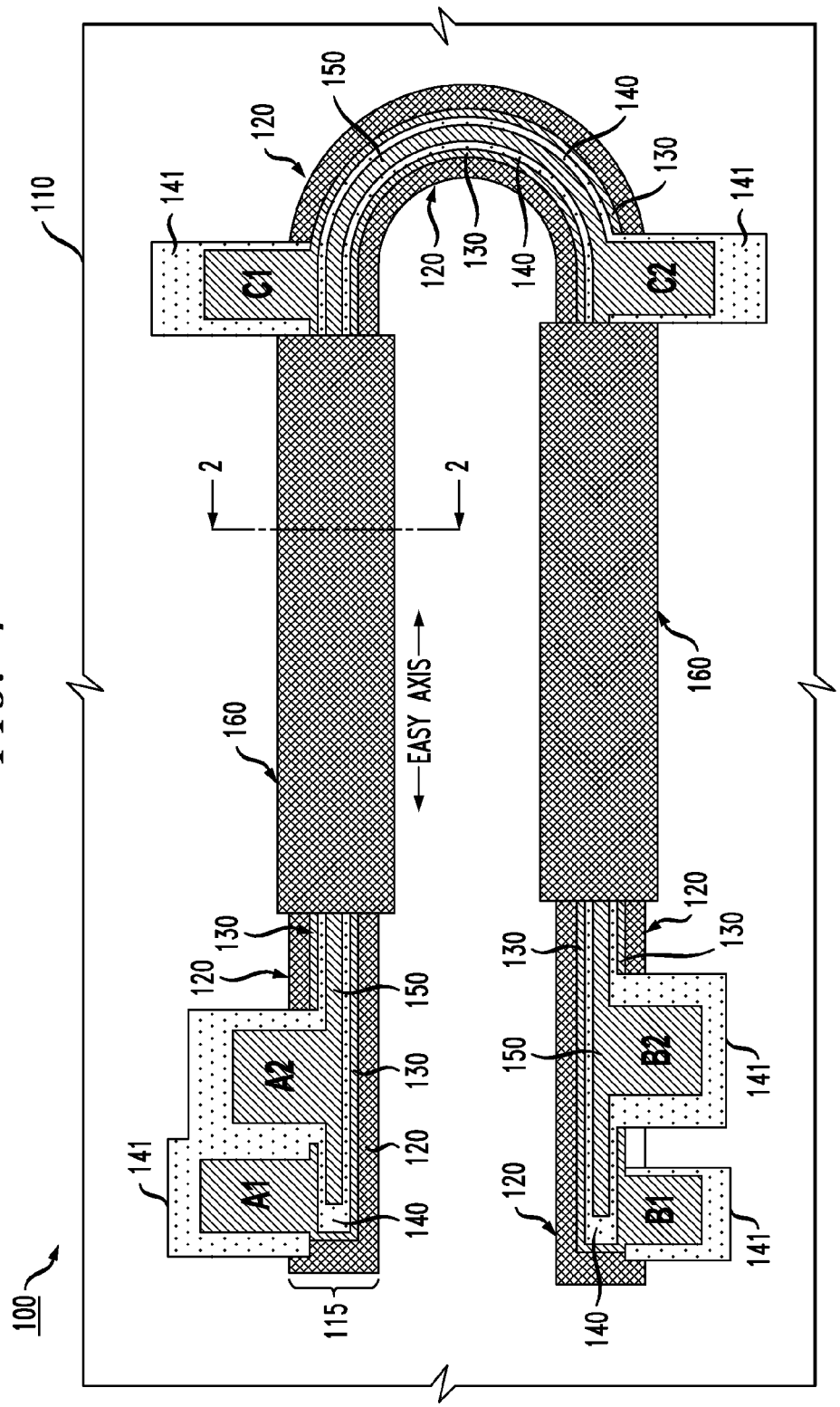
FIG. 1 schematically illustrates a semiconductor trench device according to an exemplary embodiment of the invention, which may be implemented as a semiconductor inductor or transformer device, according an exemplary embodiment of the invention.
Figure 2:
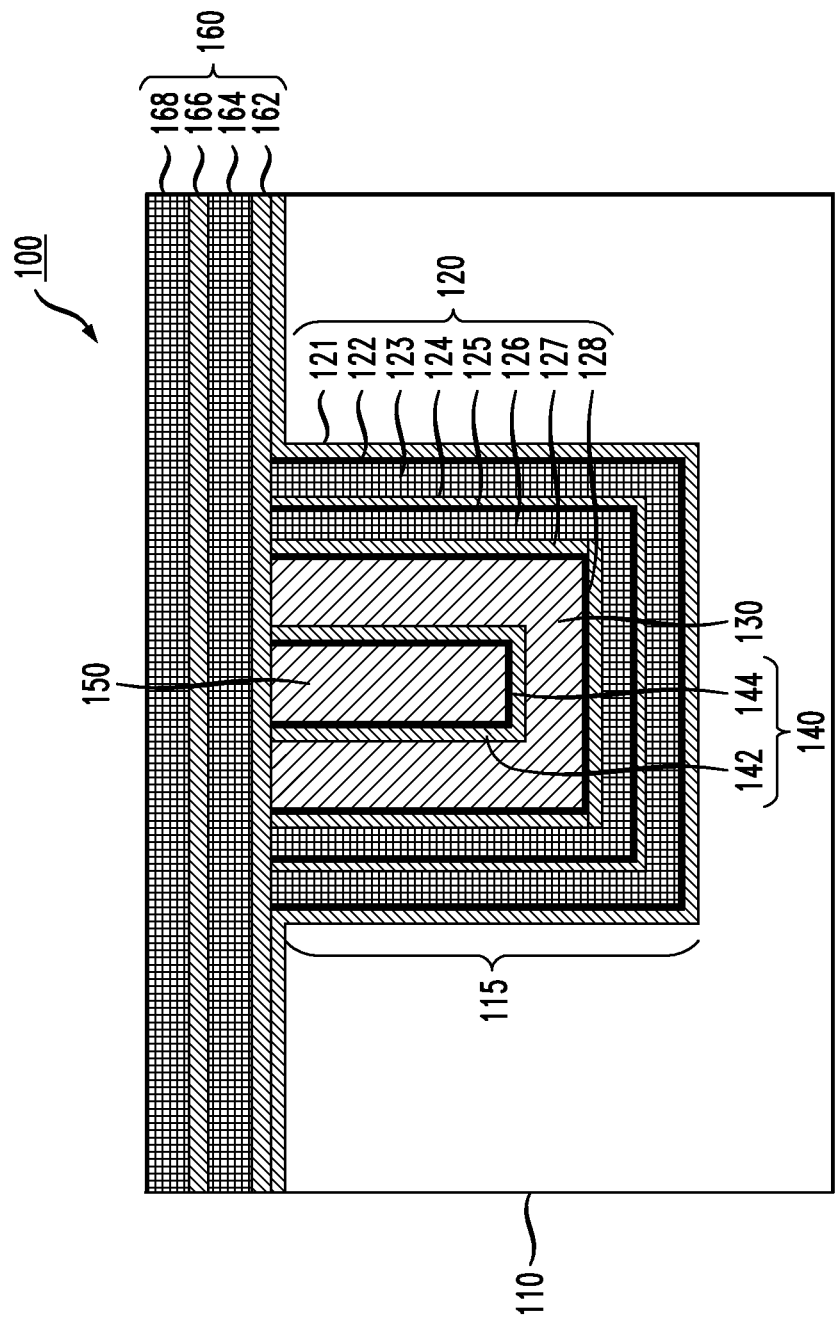
FIG. 2 is a schematic cross-sectional view of the semiconductor trench device taken along line 2-2 in FIG. 1, according to an exemplary embodiment of the invention.

A semiconductor trench device according to one exemplary embodiment of the invention will now be discussed in further detail with initial reference to FIGS. 1 and 2. In particular, FIG. 1 is a schematic top plan view of a semiconductor trench device 100 according to an exemplary embodiment of the invention, which may be implemented as a semiconductor inductor or semiconductor transformer device, and FIG. 2 is a schematic cross-sectional view of the semiconductor trench device 100 taken along line 2-2 in FIG. 1. In general, the semiconductor trench device 100 comprises a semiconductor substrate 110 and a plurality of magnetic, insulating, and conductive layers formed within a trench 115 that is etched in the semiconductor substrate 110. The device layers include a magnetic layer 120, a first conductor layer 130, an insulating layer 140, and a second conductor layer 150.

As shown in FIG. 2, the magnetic layer 120 is formed in the trench 115 and conformally lines the substrate sidewalk and bottom surface of the trench 115. In one exemplary embodiment of the invention, as specifically shown in FIG. 2, the magnetic layer 120 is a multilayer structure comprising a plurality of sequentially formed conformal layers 121/122/123/124/125/126/127/128, which will be described in further detail below. The first conductor layer 130 conformally covers the sidewalk and bottom of the magnetic layer 120 in the trench 115. The insulating layer 140 conformally covers the sidewalk and bottom of the first conductor layer 130. In one exemplary embodiment of the invention, as specifically shown in FIG. 2, the insulating layer 140 is a multilayer structure comprising a plurality of sequentially formed conformal layers 142/144, which will be described in further detail below. The second conductor layer 150 fills a remaining gap within the trench 115. The insulating layer 140 electrically isolates the first conductor layer 130 from the second conductor layer 150.

The semiconductor trench device 100 depicted in FIGS. 1 and 2 further comprises upper magnetic layers 160 that cover portions of the trench along the "easy axis" of the semiconductor trench device 100. As specifically shown in FIG. 2, each upper magnetic layer 160 is multilayer structure comprising a plurality of sequentially formed layers 162/164/166/168, which will be described in further detail below. The conformal magnetic layer 120 within the trench 115 and the upper magnetic layers 160 formed over portion of the trench serve to completely enclose the portions of the conductor layers 130 and 150 along the easy axis region of the trench device 100, thereby forming a closed loop of magnetic material that carries the magnetic flux fields generated by current flowing through the first and second conductors 130 and 150.

As further depicted in FIG. 1, the semiconductor trench device 100 comprises a plurality of input and output pads connected to the ends of the conductor layers 130 and 150. In particular, the first conductor 130 comprises an input pad A1 and output pad B1. The second conductor 150 comprises an input pad A2 and an output pad B2. The first and second conductors 130 and 150 further include respective intermediate taps C1 and C2, which are located at a bent region of the semiconductor trench device 100. The semiconductor trench device 100 further comprises a plurality of insulating layers 141 that are formed under the input, output and intermediate pads A1, B1, A2, B2, C1, C2, to electrically isolate the pads from other component layers of the trench device 100 and the substrate 110.

It is to be appreciated that the semiconductor trench device such as shown in FIG. 1 can have one bend, or multiple bends, to allow for structural compactness. However, the bent structure is optional, wherein a semiconductor trench device according to principles of the invention may be designed with a complete linear structure. In the bent region, the thin magnetic layer 120 (which may comprise multiple thin layers of magnetic material separated by insulating layers) will exhibit well-behaved magnetic properties along a direction perpendicular to the "easy axis" of the semiconductor trench device 100. As such, there is less of a need to form upper magnetic layers over the bent region of the trench device 100. Moreover, although the intermediate taps C1 and C2 are shown being formed within the bent region of the trench device 100, the intermediate taps may be formed in any desired region of the trench 100, including the easy axis region by interrupting an upper magnetic layer 160.

It is to be appreciated that the semiconductor trench device 100 of FIG. 1 may be implemented as a semiconductor inductor or transformer device, or other magnetic structures, depending on the number of conductors implemented, and the manner in which electrical connections are made to and between the various input, output and intermediate taps A1, B1, C1, A2, B2 and C2. For instance, to implement a one-turn inductor using the first conductor layer 130, an electrical input connection can be made to the input tap A1 of the first conductor 130, and an electrical output connection can be made to the output tap B1 of the first conductor 130. For a multi-turn inductor configuration, such as a two-turn inductor, both conductors 130 and 150 are used, whereby an electrical input connection can be made to the input tap A1 of the first conductor 130 and an electrical output connection can be made to the output tap B2 of the second conductor 150, and wherein the output tap B1 of the first conductor 130 is connected to the input tap A2 of the second conductor 150. This design concept can be readily extended to a semiconductor trench device having three or more conductors, n conductors, wherein an electrical input connection is made to the input A1 of the first conductor, wherein an electrical output connection is made to the output Bn of the nth (last) conductor, and wherein connections are made from the output to the input of successive conductors, e.g., B1 to A2, B2 to A3, . . . Bn-1 to An.

Moreover, to implement a basic 1:1 transformer device using the semiconductor trench device 100 of FIG. 1, the first conductor 130 my be a primary coil winding with input/output taps A1/B1, and the second conductor 150 may be a secondary coil winding with input/output taps A2/B2. In addition, to implement a two-phase coupled inductor device using the semiconductor trench device 100 of FIG. 1, a first phase (phase 1) could be implemented with the first conductor with the input of A1 and an output of B1, and a second phase (phase 2) could be implemented with input of C2 and an output of B2.

In other exemplary embodiments of the invention, a coupled inductor structure can be fabricated using a plurality of the semiconductor trench device 100 shown of FIG. 1. For instance, a three-phase, coupled inductor structure can be fabricated using three semiconductor trench devices 100 as shown in FIG. 1. Assuming the three trench devices 100 are denoted X1 and X2 and X3, a three phase coupled inductor can be fabricated by connecting the input and output taps A1 and B1 of each of the semiconductor trench devices 100 as denoted in the following Table.

| Phase | Input | Link Connection | Output |
|-------|-------|-----------------|--------|
| 1 | X1:A1 | X1:B1 to X2:A2 | X2:B2 |
| 2 | X2:A1 | X2:B1 to X3:A2 | X3:B2 |
| 3 | X3:A1 | X3:B1 to X1:A2 | X1:B2 |

In general, the maximum current that can be regulated by a trench inductor is limited by the magnetic saturation in the magnetic material surrounding the conductor coils. One way to increase the total deliverable current is to break the current cycles into multiple phase-offset phases and use coupled inductor structures. In a coupled inductor structure such as outlined above, each inductor section has turns from two or more phases, and the currents are applied so that the DC component of the phases are in opposite directions to thereby cancel the induced magnetic responses.

In accordance with principles of the invention, semiconductor trench devices can be constructed with magnetic layers that are formed of one layer of magnetic material, or multiple layers of magnetic materials. For instance, as specifically shown in FIG. 2, the magnetic layer 120 is a multilayer structure comprising a plurality of sequentially formed conformal layers including a first conformal insulating layer 121, a first conformal seed layer 122, a first magnetic layer 123, a second conformal insulating layer 124, a second conformal seed layer 125, a second magnetic layer 126, a third conformal is kiting layer 127, and a third conformal seed layer 128. Moreover, each upper magnetic layer 160 is multilayer structure comprising a plurality of sequentially formed conformal layers including a first insulating layer 162, a first magnetic layer 164, a second insulating layer 166, and a second magnetic layer 168.

In general, the use of multiple layers of magnetic material separated by layers of insulating material serves to prevent build-up of eddy currents in the magnetic material, which can cause substantial loss. Indeed, in order to obtain desirable operating characteristics for a given frequency of operation, the required thickness of a single magnetic layer for the given operating frequency may result in the build-up of eddy currents in the magnetic material during operation, thereby resulting in some loss. On the other hand, by forming a magnetic layer with multiple layers of magnetic material separated by insulating layers, an overall effective thickness in the magnetic layer can be obtained for proper operation, while maintaining each separate layer of magnetic material thin enough to prevent formation of loops of eddy current in the magnetic material, for the given frequency of operation. The various device layers shown in FIG. 2 will now be discussed in further detail with reference to FIGS. 3A, 3B, 3C, 3D, 3E, 3F, 3G, 3H, 3I and 3J, which schematically illustrate a method for constructing a semiconductor trench device, according to an exemplary embodiment of the invention.

Figure 3A:
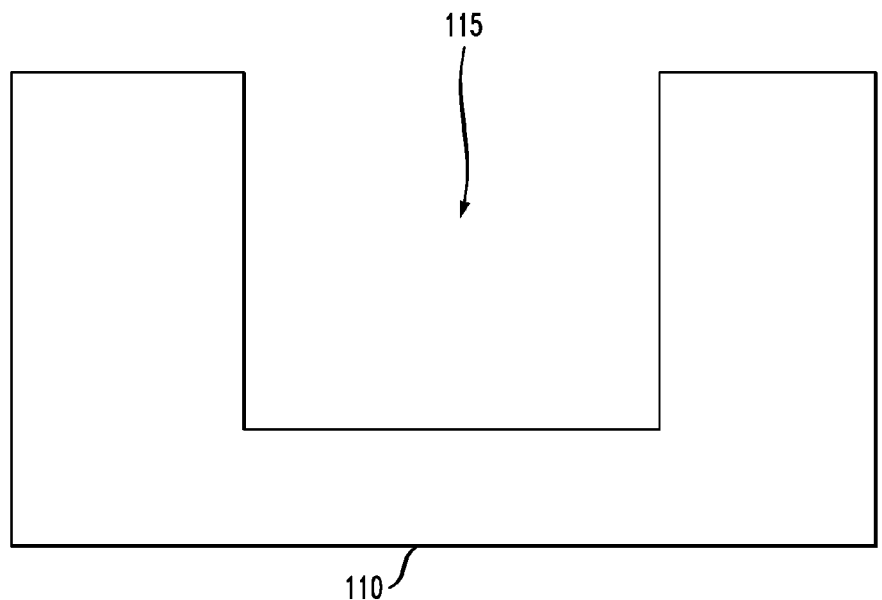

In particular, FIGS. 3A, 3B, 3C, 3D, 3E, 3F, 3G, 3H, 3I and 3J are cross-sectional views of the semiconductor trench device 100 depicted in FIG. 2 at various stages of fabrication. FIG. 3A is a cross-sectional view of the semiconductor trench device 100 at an initial stage of fabrication wherein a trench 115 is formed in a semiconductor substrate 110. The semiconductor substrate 110 can be a silicon substrate, an SIO (silicon on insulator) substrate, or the substrate 110 can be formed with any other type of semiconductor substrate material, or multiple layers of substrate materials, as commonly used in VLSI device fabrication. The trench 115 may be formed using known etching methods such as a deep reactive-ion etching (DRIE) process.

As is known in the art, DRIE is a highly anisotropic etching process used to create deep, steep-sided holes and trenches in wafers, with aspect rations of about 20:1 or more. DRIE methods can be used for forming trenches and through-substrate-vias (TSVs) in advanced three-dimensional wafer level packaging technology. It is to be understood that the trench 115 can be formed by etching the front (active) surface of the semiconductor substrate 110 or the backside of the semiconductor substrate 110. In silicon wafer implementations where the substrate 110 is subjected to a wafer thinning process, semiconductor trench devices according to principles of the invention may be formed on the back (non-active) surface of the substrate 110 to preserve the active surface area. Moreover, with semiconductor trench devices formed on the wafer backside, a plurality of TSVs would also be formed to provide electrical connections between the semiconductor trench device and circuitry formed on the active surface of the substrate 110.

Figure 3B:
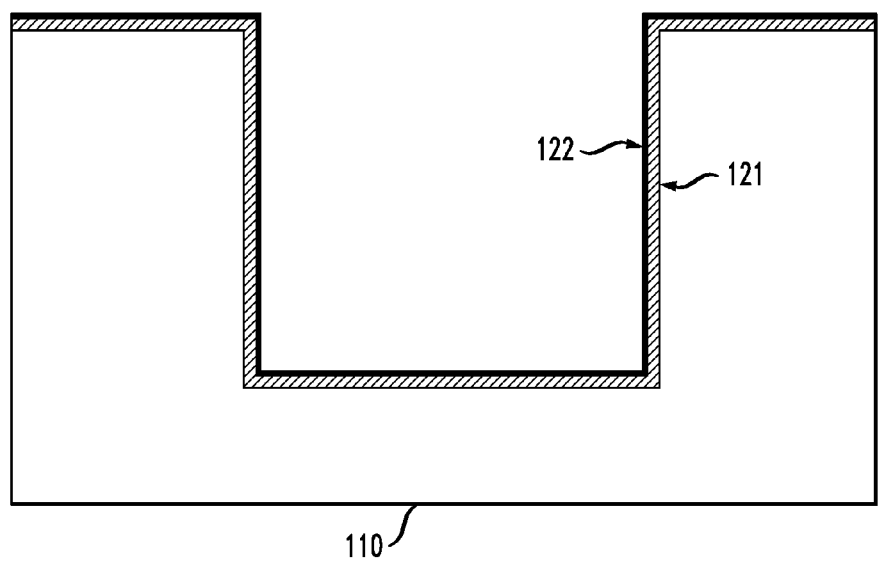

A next step in the exemplary fabrication process comprises forming the magnetic layer 120 that lines the sidewalk and bottom of the trench 115 (as depicted in FIG. 2). FIGS. 3B through 3F schematically illustrate process steps for forming the magnetic layer 120, according to an exemplary embodiment of the invention. FIG. 3B is a cross-sectional view of the structure of FIG. 3A after forming a first conformal insulating layer 121 and a first conformal seed layer 122 over the substrate 110 and lining the trench 115. The first conformal insulating layer 121 may be formed with any suitable insulating material, such as silicon dioxide, silicon nitride, aluminum oxide, polymers such as polyimide, PBO (poly (p-phenylene benzoxazole)) and other insulating or dielectric materials, which are commonly used for VLSI device fabrication and deposited using known techniques. The insulating layer may be deposited using known deposition techniques such as PVD (physical vapor deposition), CVD (chemical vapor deposition), or ALD (atomic layer deposition) methods. The first conformal insulating layer 121 may comprise one or multiple layers of materials, serving as a barrier layer, adhesion layer and/or an insulating liner, as is readily understood by those of ordinary skill in the art. For instance, and adhesion or liner layer may comprise a Tantalum Nitride/

Tantalum (TaN/Ta) or a Titanium Nitride/Titanium bi-layer, and other suitable materials, which may be conformally deposited/grown using methods such as PVD, CVD, or ALD.

After forming the first conformal insulating layer 121, an electrically conducting seed layer 122 may be conformally deposited to provide a base layer for a subsequent plating process to form a layer of magnetic material on the seed layer 122. The first conformal seed layer 122 may be formed with any suitable material, such as NiFE, CoFE, or other known materials, that are commonly used as a seed layers that serve as a cathode for an electro-plating process to grow a layer of magnetic material thereon. The first conformal seed layer 122 may b deposited by PVD, CVD or ALD. Optionally, small amounts of organic material can be added to the first conformal seed layer 122 to increase the plating rate. Adding the organic material allows differential-rate plating, super-filling, super-conformal, or bottom-up plating.

Figure 3C:
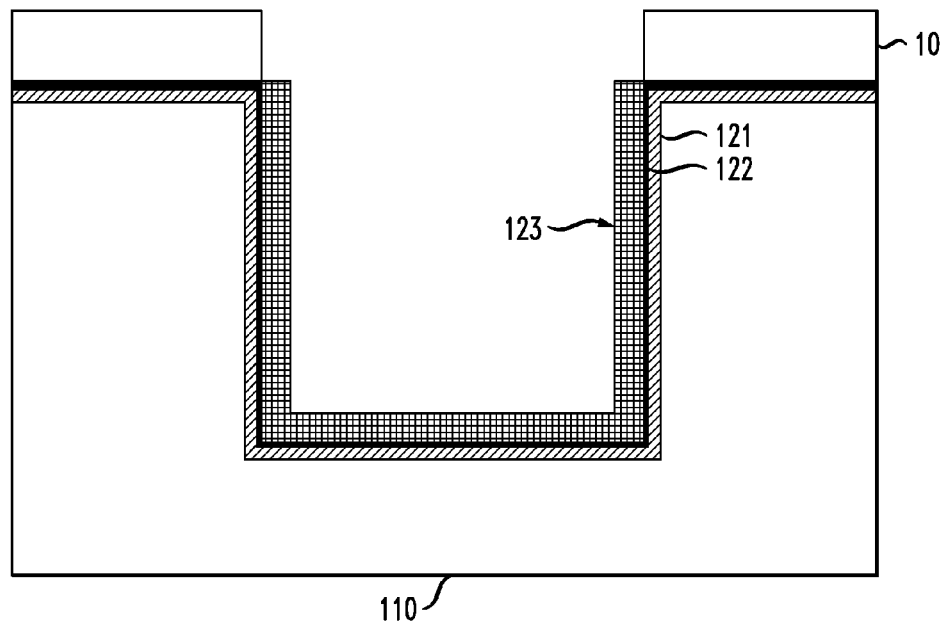

A next step in the exemplary fabrication process is to form a first layer of magnetic material on the first conformal seed layer 122 lining the sidewalk and bottom surface of the trench 115. For example, FIG. 3C is a cross sectional view of the structure of FIG. 3B after forming a first magnetic layer 123 over a portion of the first conformal seed layer 122 within the trench 115. With this process, a layer of photoresist is deposited and patterned to form a photoresist pattern 10 that covers a portion of the first conformal seed layer 122 disposed on the surface of the substrate 110, such as shown in FIG. 3C. An electroplating process is then performed to grow the first magnetic layer 123 on the exposed surfaces of the first conformal seed layer 122 within the trench 115. The first magnetic layer 123 may be formed by plated or sputtered materials such as permalloy or magnetic alloys of Co, Fe, Ni, of CoFeTa, other suitable magnetic materials known in the art.

Figure 3D:
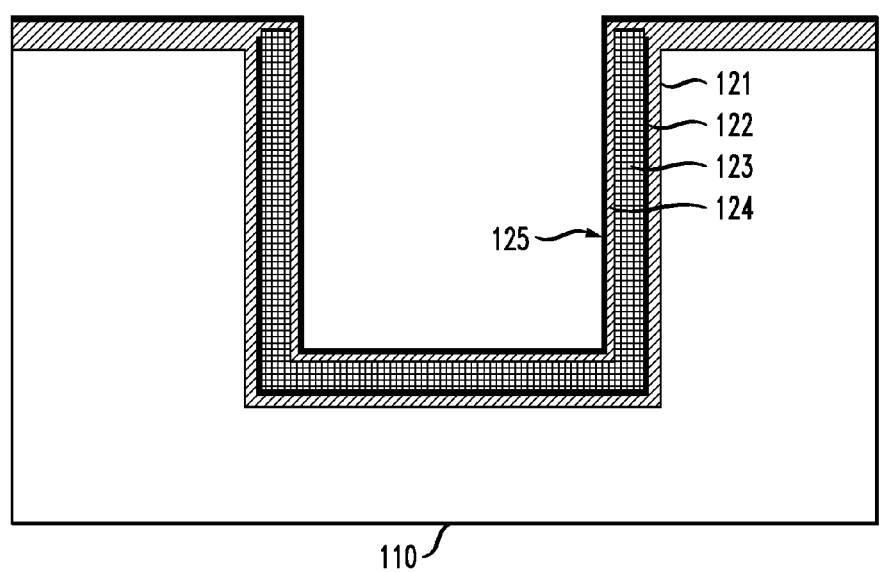

After forming the first magnetic layer 123, a second layer of insulating material and seed layer are formed on the first magnetic layer 123 within the trench. For example, FIG. 3D is a cross-sectional view of the structure of FIG. 3C after forming a second 1 conformal insulating layer 124 and a second conformal seed layer 125 over the substrate 110, and lining the first magnetic layer 123 within the trench 115. With this process, the photoresist pattern 10 (in FIG. 3C) is first removed to expose the portion of the first conformal seed layer 122 disposed on the surface of the substrate 110 outside the trench 115, followed by removal of the exposed portion of the first conformal seed layer 122 outside the trench 115. Then, the second conformal insulating layer 124 is deposited over the substrate 110 lining the first magnetic layer 123, and the second conformal seed layer 125 is deposited over the second formal insulating layer 124. The second conformal insulating layer 124 serves to isolate the first magnetic layer 123 from a second layer of magnetic material to be formed on the second conformal seed layer 125. The second conformal insulating layer 124 and second conformal seed layer 125 may be formed using those materials and methods as discussed above for first conformal insulating and seed layers.

Figure 3E:
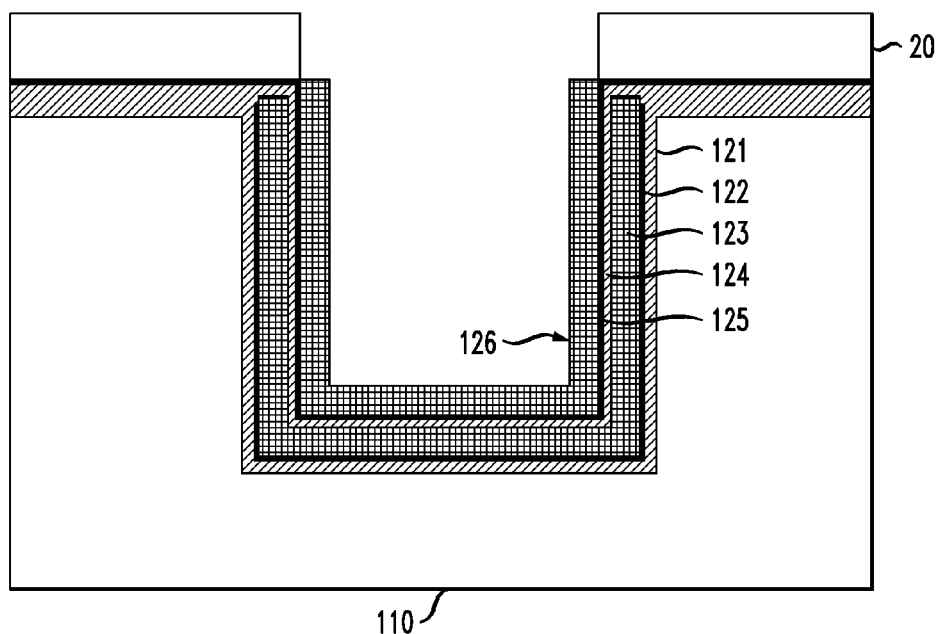

FIG. 3E is a cross sectional view of the structure of FIG. 3D after forming a second magnetic layer 126 over a portion of the second conformal seed layer 125 within the trench 115. With this process, a layer of photoresist is deposited and patterned to form a photoresist pattern 20 that covers a portion of the second conformal seed layer 125 disposed on the surface of the substrate 110 outside the trench 115. An electroplating process is then performed to grow the second magnetic layer 126 on the exposed surfaces of the second conformal seed layer 125 within the trench 115. The second magnetic layer 126 may be formed using any suitable material and methods as discussed above for the first magnetic layer. For instance, the second magnetic layer 126 may be electroplated onto the second conformal seed layer 125 in a process equivalent to plating the first magnetic layer 123 onto the first conformal seed layer 122.

Figure 3F:
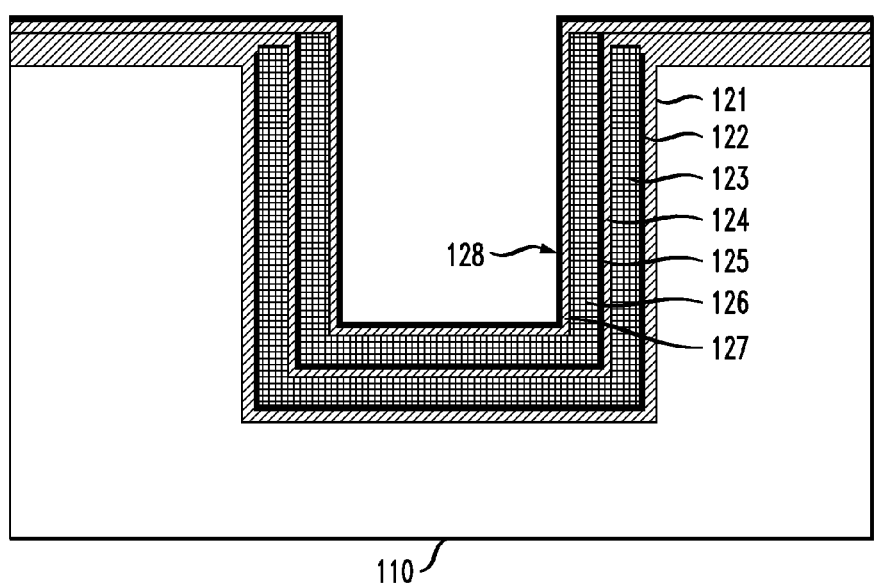

After forming the second magnetic layer 126, a third layer of insulating material and seed layer are formed on the second magnetic layer 126 within the trench. For example, FIG. 3F is a cross-sectional view of the structure of FIG. 3D after forming a third conformal insulating layer 127 and a third conformal at seed layer 128 over the substrate 110, and lining the second magnetic layer 126 within the trench 115. With this process, the photoresist pattern 20 (in FIG. 3E) is first removed to expose the portion of the second seed layer 125 disposed on the surface of the substrate 110 outside the trench 115, and then the exposed portion of the second conformal seed layer 125 on the substrate surface is removed. Then, the third conformal insulating layer 127 is deposited over the substrate 110 lining the second magnetic layer 126, and the third conformal seed layer 128 is deposited over the third conformal insulating layer 127. The third conformal insulating layer 127 serves to isolate the second magnetic layer 126 from a first conductor layer to be formed on the third conformal seed layer 128.

Figure 3G:
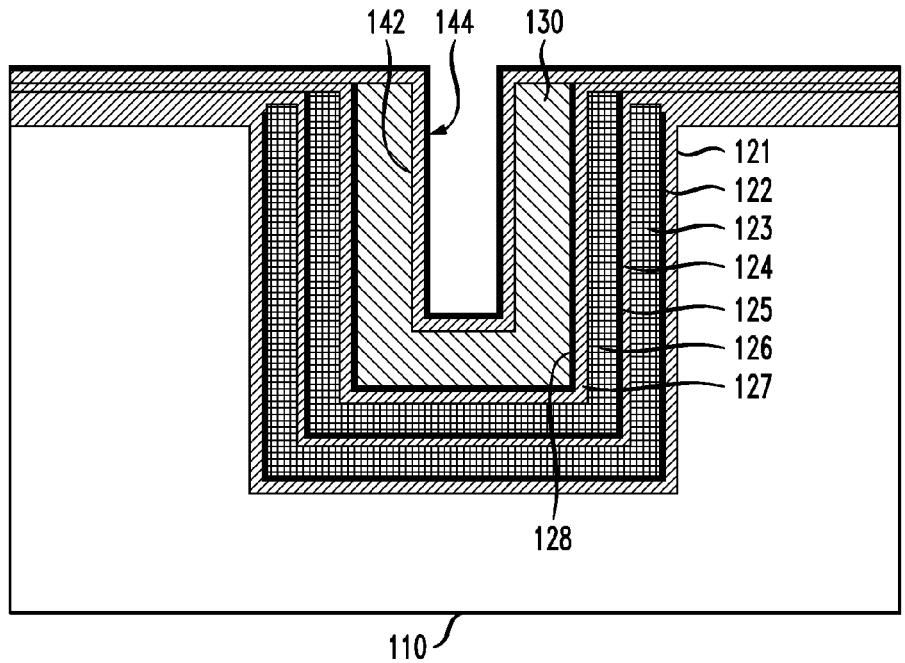

In particular, FIG. 3G is across sectional view of the structure of FIG. 3F after forming a first conformal conductor layer 130 over a portion of the third conformal seed layer 128 within the trench 115 and forming a fourth conformal insulating layer 142 and fourth conformal seed layer 144 over the substrate and lining the first conductor layer 130 within the trench 115. With this process, a layer of photoresist may b deposited and patterned (over the structure shown in FIG. 3F) to cover a portion of the third conformal seed layer 128 disposed on the surface of the substrate 110. An electroplating process is then performed to grow the first conductive layer 130 on the exposed surfaces of the third conformal seed layer 128 within the trench 115. The first conductive layer 130 may be formed with any suitable metallic material such as copper or other electrically conductive materials used in silicon processes including, for example, aluminum. By way of specific example, plating of copper material may be performed using an electro-plating process wherein copper material is plated onto the exposed portion of the third conformal seed layer 128 lining the trench 115.

After the first conductor layer 130 is formed, the photoresist pattern can be removed followed by removal of the portion of the third conformal seed layer 128 exposed on the surface of the substrate. In another exemplary embodiment, the portion of the third conformal seed layer 128 on the substrate surface can be removed prior to the electroplating process to form the first conductor layer 130, so that the copper material is plated on the exposed portion of the third conformal seed layer 128 lining the trench. After the first conductor layer 130 is formed, the fourth conformal insulating layer 142 and fourth conformal seed layer 144 are formed over the substrate and lining the first conductor layer 130 in the trench 115, such as shown in FIG. 3G.

Figure 3H:
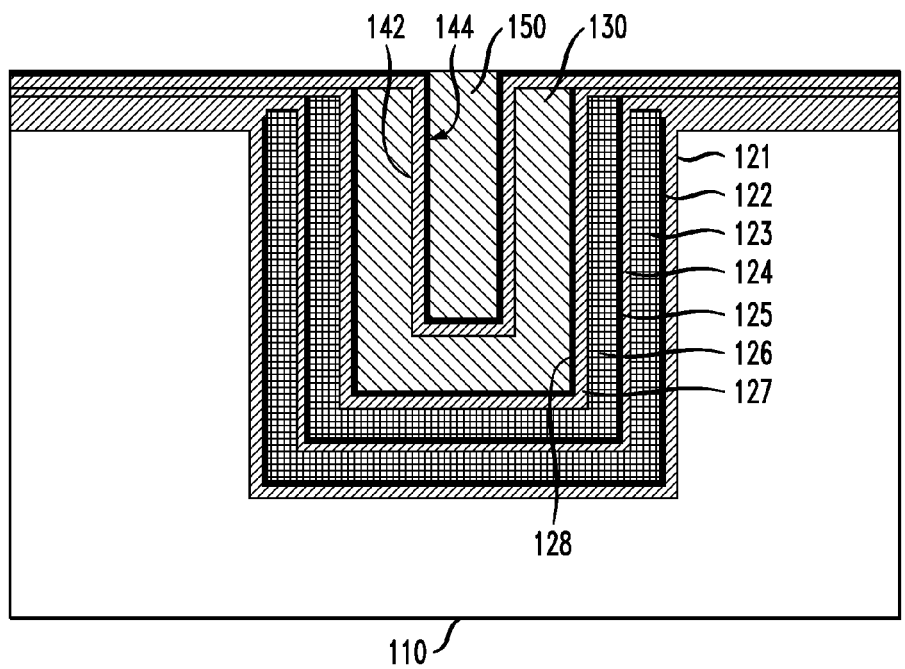

A next step of the exemplary fabrication process is to form a second conductive layer within the trench 115, which is electrically isolated from the first conductive layer 130. In particular, FIG. 3H is a cross-sectional view of the structure of FIG. 3G after forming a second conductive layer 150 on the fourth conformal seed layer 144 within the trench. With this process, a layer of photoresist may be deposited and patterned (over the structure shown in FIG. 3G) to cover a portion of the fourth conformal seed layer 124 disposed on the surface of the substrate 110. An electroplating process is then performed to grow the second conductive layer 150 on the exposed surfaces of the fourth conformal seed layer 144 within the trench 115. The second conductive layer 150 may be formed with any suitable metallic material such as copper or other electrically conductive materials used in silicon processes including, for example, aluminum. By way of specific example, plating of copper material may be performed using an electro-plating process wherein copper material is plated onto the exposed portion of the fourth conformal seed layer 142 lining the trench 115. The fourth conformal insulating layer 142 serves to electrically isolate the first and second conductor layers 130 and 150. It is to be appreciated that in addition to conductor layers 130 and 150, one or more additional conductor layers can be formed by repeating the steps of depositing an insulating layer, depositing a seed layer and depositing a conducting layer. As shown in FIG. 3H, the second conductor layer 150 is the last conductor layer that is formed which fills the remaining trench opening with metallic material. In another exemplary embodiment, gap can left in the trench 115, which is tilled with a compliant layer such as polyimide to allow for plating unevenness and thermal expansion.

Figure 3I:
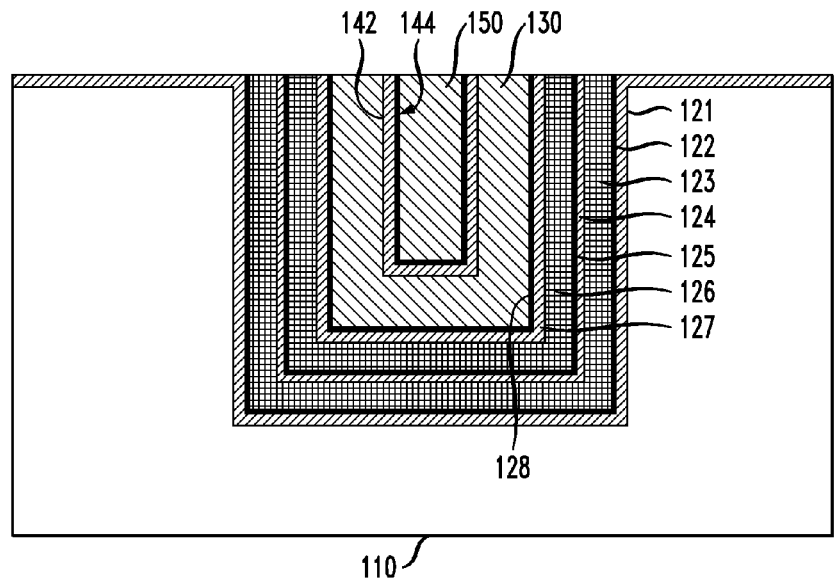

Following formation of the second conductor layer 150, the substrate surface may be planarized prior to forming additional device structures on the substrate surface. For instance, FIG. 3I is a cross-sectional view of the structure of FIG. 3H after planarizing the surface of the structure of FIG. 3H. In one preferred embodiment, the substrate surface is planarized no that the exposed upper surfaces of the magnetic layers 123, 126 and conductor layers 130, 150 are substantially even with one another. The planarizing process may be performed using a CMP (chemical mechanical polish) process to polish and planarize the substrate surface. Following the planarizing process, one or more layers of magnetic material are formed on the surface of the substrate 110 covering the trench structure 115.

Figure 3J:
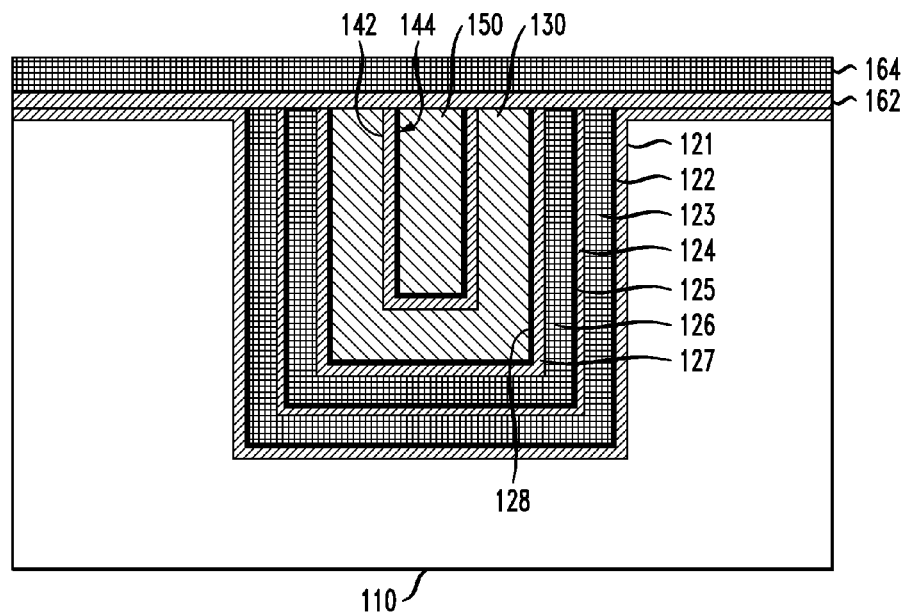
FIG. 3J is a cross-sectional view of the structure of FIG. 3I after forming an insulating layer and layer of magnetic material on the planarized substrate surface.

For instance, FIG. 3J is a cross-sectional view of the structure of FIG. 3I after forming a first insulating layer 162 and a first magnetic layer 164 on the planarized substrate surface over the trench structure. A second insulating layer 166 and second magnetic layer 168 may also be deposited over the structure depicted in FIG. 3J to form an upper magnetic layer 160 that covers the trench structure 115, as depicted in FIG. 2. It is to be understood that with additional processing steps known in the art, interconnect wiring may be formed on the substrate to connect the device conductor layers 130 and 150 together to form inductive loops and/or transformers, such as discussed above.

Figure 4:
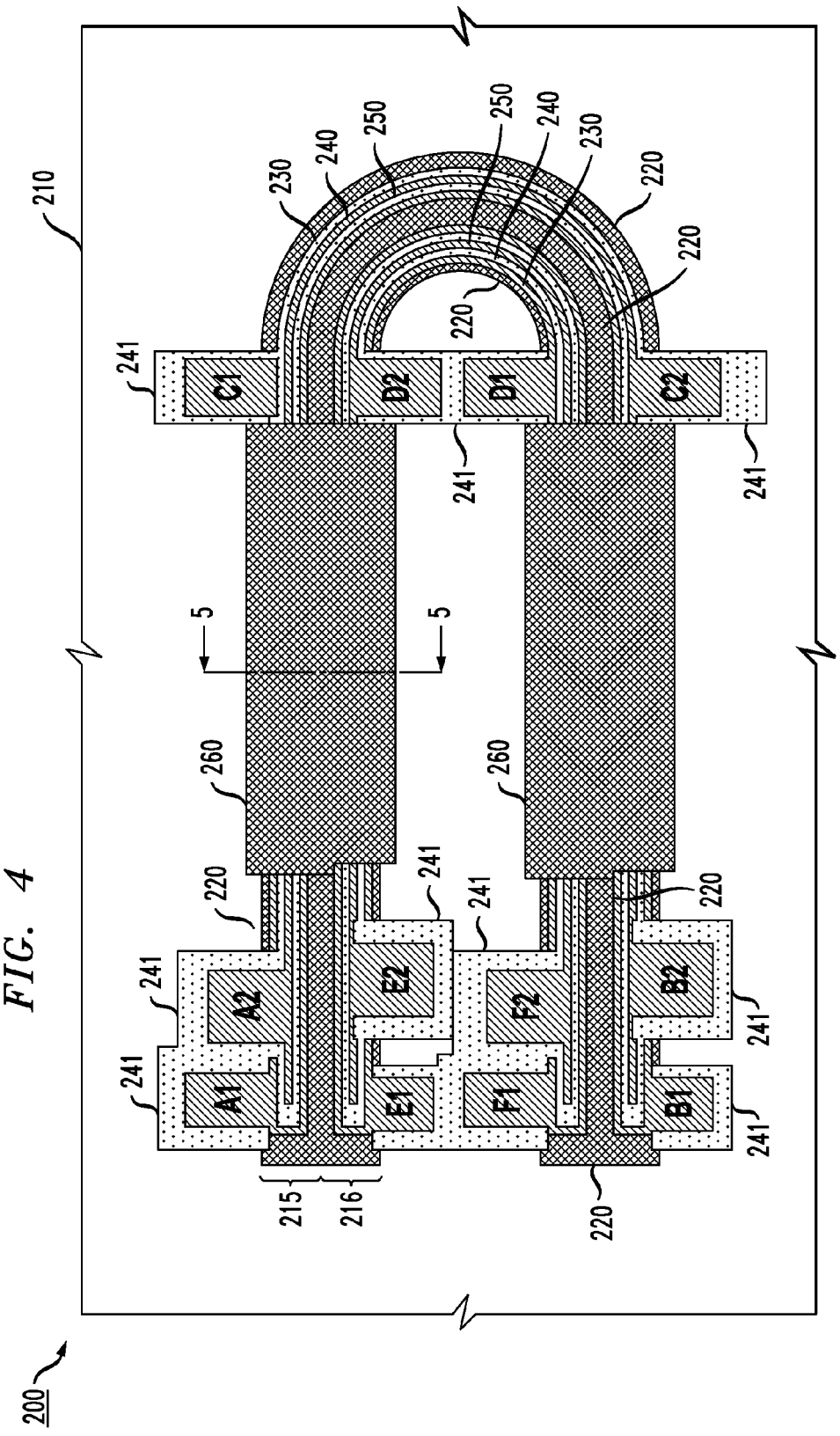
FIG. 4 schematically illustrates a semiconductor trench device according to another exemplary embodiment of the invention, which may be implemented as a semiconductor inductor or transformer device.
Figure 5:
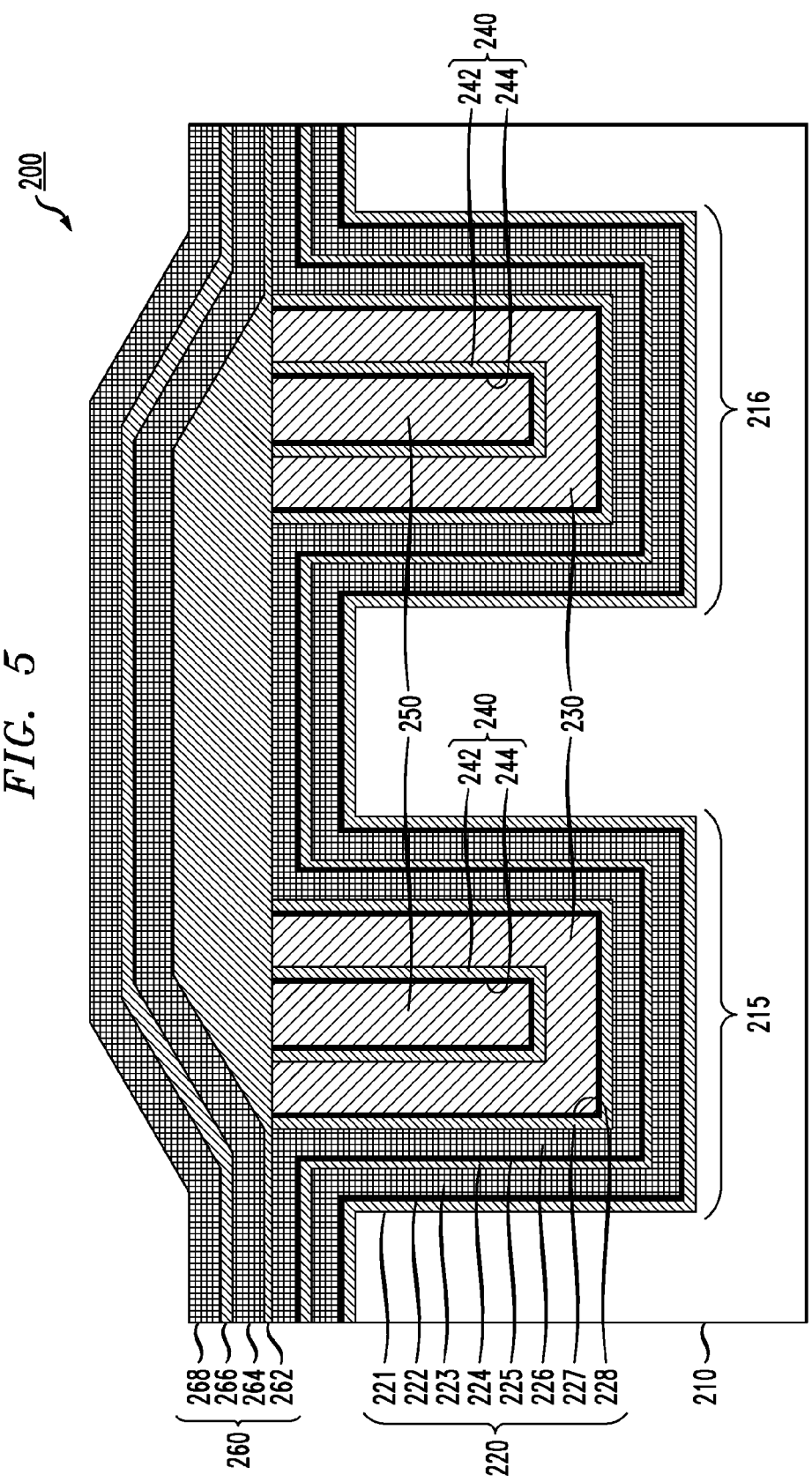
FIG. 5 is a schematic cross-sectional view of the semiconductor trench device taken along line 5-5 in FIG. 4, according to an exemplary embodiment of the invention.

A semiconductor trench device according to another exemplary embodiment of the invention will now be discussed in further detail with initial reference to FIGS. 4 and 5. In particular, FIG. 4 is a schematic top plan view of a semiconductor trench device 200 according to an exemplary embodiment of the invention, which may be implemented as a semiconductor inductor or semiconductor transformer device, and FIG. 5 is a schematic cross-sectional view of the semiconductor trench device 200 taken along line 5-5 in FIG. 4. In general, the semiconductor trench device 200 comprises a semiconductor substrate 210 and a plurality of magnetic, insulating, and conductive layers formed within first and second trenches 215 and 216, which are etched in the semiconductor substrate 210. The device layers include a magnetic layer 220, a first conductor layer 230, an insulating layer 240, and a second conductor layer 250.

As shown in FIG. 5, the magnetic layer 220 is formed in the trenches 215 and 216, and conformally lines the substrate sidewalls and bottom surfaces of the trenches 215 and 216. In one exemplary embodiment of the invention, as specifically shown in FIG. 5, similar to the magnetic layers 120 discussed above with reference to FIGS. 2 and 3A-3J, the magnetic layer 220 is a multilayer structure comprising a plurality of sequentially formed layers including a first conformal insulating layer 221, a first conformal seed layer 222, a first magnetic layer 223, a second conformal insulating layer 224, a second conformal seed layer 225, a second magnetic layer 226, a third conformal insulating layer 227, and a third conformal seed layer 228, which are formed in both trenches 215, 216. The first conductor layer 230 conformity covers the sidewalk and bottom of the magnetic layer 220 in the trenches 215 and 216, thereby providing a first conductor in each trench 215, 216. The insulating layer 240 conformity covers the sidewalls and bottom of the first conductor layer 230 in both trenches 216, 216. The insulating layer comprises a layer of insulating/barrier material 242 and a seed layer 244. The second conduct aye. 250 fills a remaining gap within the trenches 215 and 216, and is ultimately formed into second conductors in each trench 215, 216. The insulating layer 240 in each trench 215, 216 electrically isolates the first conductor 230 from the second conductor 250.

The semiconductor trench device 200 depicted in FIGS. 4 and 5 further comprises upper magnetic layers 260 that cover portions of the trench along the "easy axis" of the semiconductor trench device 200. As specifically shown in FIG. 5, each upper magnetic layer 260 are dome-shaped multilayer structures comprising a plurality of sequentially formed layers including a first insulating layer 262, a first magnetic layer 264, a second insulating layer 266 and a second magnetic layer 268. The dome-shaped structure may be formed, for example, wherein the first insulating layer 262 is formed depositing a thick area of photoresist (defined by photo imaging), and warming it enough that the photoresist material softens and flows to form a rounded dome. It is then baked long and hot enough to cross-link and harden the photoresist so it is no longer soluble in photoresist developers. The first insulating layer 262 may be formed of other suitable materials such as PBO or polymers. The rounded structure of the insulating layer 262 avoids sharp bends in the upper magnetic layers 264 and 268 formed on top of the insulating layer 262, which can cause stress related magnetic misbehavior.

It is to be appreciated that with a multi-trench design as shown in FIGS. 4 and 5, the dome shaped upper magnetic layers 260 together with the conformal magnetic layer 220 within the trenches 115 serve to completely enclose the conductor layers 230 and 250 of the trench device 200, thereby forming a closed loop of magnetic material that carries the magnetic flux fields generated by current flowing through the first and second conductors 230 and 250. In particular the conformal magnetic layer 220 is a continuous magnetic layer that is formed from the outside end of the first trench 215 to the outside end of the second trench 216, wherein the ends of the conformal magnetic layer 220 that overlap the upper surface of the substrate 210 (adjacent the outside ends of the trenches 215, 216) are magnetically coupled to the respective ends of the upper dome-shaped magnetic layer 260, thereby forming a closed loop of magnetic material around both trenches 215, 216. By forming the dome-shaped magnetic layer 260 with a raised mid-section, the length of the leakage path is increased from the upper magnetic layer 260 to the conductor layers 230 and 250 in the trenches 215 and 216, and the portion of the magnetic layer 220 between the trenches 215 and 216. In this manner, the dome-shaped magnetic layer 260 and the continuous trench magnetic layer 220 effectively form a closed loop in which magnetic flux primarily flows around the conductors 230 and 250 in the trenches. Since the permeability of the soft magnetic film making up the magnetic layers 220 and 260 can be about 1000 times that of nonmagnetic materials of the device, the use of the domed structure increases the energy storage of the trench device 200. The use of multiple trenches 215 and 216 with multiple conductors also increases the inductance of the semiconductor trench inductor device 200.

As further depicted in FIG. 4, the semiconductor trench device 200 comprises a plurality of input and output pads connected to the ends of the conductor layers 230 and 250 in each of the trenches 215 and 216. In particular, the first conductor 230 in the first trench 215 comprises an input pad A1 and output pad B1. The second conductor 250 in the first trench 215 comprises an input pad A2 and an output pad B2. The first and second conductors 230 and 250 in the first trench 215 further include respective intermediate taps C1 and C2, which are located at a bent region of the semiconductor trench device 200. Moreover, the first conductor 230 in the second trench 216 comprises an input pad E1 and output pad F1. The second conductor 250 in the second trench 216 comprises an input pad E2 and an output pad F2. The first and second conductors 230 and 250 in the second trench 216 further include respective intermediate taps D1 and D2, which are located at a bent region of the semiconductor trench device 200.

The semiconductor trench device 200 further comprises a plurality of insulating layers 241 that are formed under the input, output and intermediate pads A1 B1, A2, B2, C1, C2, D1, D2, E1, E2, F1 and F2, to electrically isolate the pads from other component layers of the trench device 200 and the substrate 210.

It is to be appreciated that the semiconductor trench device such as shown in FIG. 4 can have one bend, or multiple bends, to allow for structural compactness. However, the bent structure is optional, wherein a semiconductor trench device according to principles of the invention may be designed with a complete linear structure.

It is to be further appreciated that the semiconductor trench device 200 of FIG. 4 may be implemented as a semiconductor inductor or transformed device, or other magnetic structures, depending on the number of conductors implemented, and the manner in which electrical connections are made to and between the various input, output and intermediate taps A1, B1, and C1 (of the first conductor 230 in the first trench 215), A2, B2 and C2 (of the second conductor 250 in the first trench 215), E1, F1 and D1 (of the first conductor 230 in the second trench 216), and E2, F2 and D2 (of the second conductor 250 in the second trench 216), using the same or similar a) interconnect concepts as discussed above with reference to FIG. 1.

It is to be understood that the invention is not limited to the particular materials, features, and structures specifically shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. However, one of ordinary skill in the art will readily recognize those features omitted from these generalized descriptions.

Further aspects of the present invention provide for use of semiconductor trench inductor and transformer devices in integrated circuits with various analog and digital circuitry. In particular, integrated circuit dies can be fabricated having semiconductor trench inductor and transformer devices and other semiconductor devices such as a field-effect transistors, bipolar transistors, metal-oxide-semiconductor transistors diodes, resistors, capacitors, inductors, etc., forming analog and/or digital circuits. The semiconductor trench inductor and transformer devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
a semiconductor substrate;
a trench formed in the semiconductor substrate, the trench defined by sidewalls and a bottom surface;
a magnetic layer formed in the trench, the magnetic layer conformally lining the sidewalls and bottom surface of the trench;
an insulating layer conformally lining the magnetic layer in the trench;
a first conductor layer formed in the trench, wherein the insulating layer electrically insulates the first conductor layer from the magnetic layer in the trench; and
an upper magnetic layer formed on the substrate and covering the trench, wherein the upper magnetic layer and the magnetic layer in the trench form a closed loop of magnetic material that encircles as least a portion of the first conductor layer formed in the trench, wherein the upper magnetic layer is electrically insulated from all conductor material in the trench.

2. The semiconductor device of claim 1, wherein the first conductor layer is a conformal layer that conformally lines the insulating layer in the trench.

3. The semiconductor device of claim 1, wherein the magnetic layer in the trench and the upper magnetic layer each comprises a multilayer structure comprising a plurality of sequentially formed magnetic and insulating material layers.

4. The semiconductor device of claim 1, wherein the trench comprises at least one bent portion.

5. The semiconductor device of claim 4, wherein the trench comprise a least one bent portion wherein at least a portion of the trench is U-shaped.

6. The semiconductor device of claim 1, further comprising:
a second insulating layer and a second conductor layer formed in the trench, wherein the second conductor layer is electrically isolated from first conductor layer by the second insulating layer, and
wherein the upper magnetic layer and the magnetic layer in the trench form a closed loop of magnetic material that encircles as least a portion of the first and second conductor layers formed in the trench, wherein the upper magnetic layer is electrically insulated from the first and second conductor layers in the trench.

7. The semiconductor device of claim 6, further comprising a first input pad, a second input pad, a first output pad and a second output pad, formed on the substrate surface, wherein the first input and output pads are connected to opposing end regions of the first conductor layer in the trench, and wherein the second input and output pads are connected to opposing end regions of the second conductor layer.

8. The semiconductor device of claim 7, further comprising an electrical connection that electrically connects the first output pad of the first conductor layer to the second input pad of the second conductor layer.

9. The semiconductor device of claim 1, wherein the trench is formed on back non-active side of the semiconductor substrate.

10. An integrated circuit chip, comprising an integrated circuit having one or more of the semiconductor device as recited in claim 1.

11. A semiconductor device, comprising:
a semiconductor substrate;
a first trench and second trench formed in the semiconductor substrate, the first and second trenches defined by sidewalls and a bottom surface;
a magnetic layer formed over the semiconductor substrate, the magnetic layer conformally lining the sidewalls and bottom surfaces of the first and second trenches, wherein the magnetic layer is continuous between the first trench and the second trench;
an insulating layer conformally lining the magnetic layer in the first and second trenches;
a first conductor formed in each of the first and second trenches, wherein the first conductor in each of the first and second trenches is electrically insulated from the magnetic layer by the insulating layer, and
an upper magnetic layer formed on the substrate and covering the first trench and the second trench, wherein the upper magnetic layer and the magnetic layer within the first and second trenches form a closed loop of magnetic material that encircles as least a portion of the first conductors formed in each of the first and second trenches, wherein the upper magnetic layer is electrically insulated from all conductor material in the first and second trenches.

12. The semiconductor device of claim 11, wherein the first conductor in each of the first and second trenches is a conformal conductive layer that conformally lines the insulating layer in the trenches.

13. The semiconductor device of claim 11, wherein the magnetic layer in the trenches and the upper magnetic layer each comprises a multilayer structure comprising a plurality of sequentially formed magnetic and insulating material layers.

14. The semiconductor device of claim 11, wherein the first and second trenches are disposed adjacent to each other and comprises at least one bent portion.

15. The semiconductor device of claim 14, wherein the first and second trenches comprise the least one bent portion forming a U-shaped trench structure.

16. The semiconductor device of claim 11, further comprising:
a second insulating layer and a second conductor formed in each of the first and second trenches, wherein the second conductor is electrically isolated from first conductor by the second insulating layer, and
wherein the upper magnetic layer and the magnetic layer in the trenches form a closed loop of magnetic material that encircles at least a portion of the first and second conductors formed in the trench, wherein the upper magnetic layer is electrically insulated from the first and second conductors in each of the first and second trenches.

17. The semiconductor device of claim 16, further comprising a first input pad, a second input pad, a third input pad, fourth input pad, a first output pad, a second output pad, a third output pad, and a fourth output pad formed on the semiconductor substrate surface, wherein the first input and output pads are connected to opposing end regions of the first conductor in the first trench, wherein the second input and output pads are connected to opposing end regions of the second conductor in the first trench wherein the third input and output pads are connected to opposing end regions of the first conductor in the second trench, and wherein the fourth input and output pads are connected to opposing end regions of the second conductor in the second trench.

18. The semiconductor device of claim 11, wherein the first and second trenches are formed on back non-active side of the semiconductor substrate.

19. An integrated circuit chip, comprising an integrated circuit having one or more of the semiconductor device as recited in claim 11.

20. The semiconductor device of claim 11, wherein the upper magnetic layer is dome-shaped.

\* \* \* \* \*